(12) United States Patent
Tenney et al.

(10) Patent No.: US 6,354,461 B1
(45) Date of Patent: Mar. 12, 2002

(54) ENCLOSURE HAVING A HINGE MEMBER BIASED BY A HAND-OPERABLE LATCH

(75) Inventors: Douglas A. Tenney, Audubon; Charles F. Niesley, Jr., Lansdale, both of PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/533,455

(22) Filed: Mar. 23, 2000

Related U.S. Application Data
(60) Provisional application No. 60/126,463, filed on Mar. 26, 1999.

(51) Int. Cl.$^7$ .............................................. B65D 51/04
(52) U.S. Cl. ................. 220/836; 16/257; 292/DIG. 17; 220/4.23; 220/4.02; 220/840
(58) Field of Search .................... 16/257, 258; 220/810, 220/820, 841, 836, 843, 844, 4.02, 4.23, 4.24, 3.2, 3.8, 840; 292/DIG. 17

(56) References Cited

U.S. PATENT DOCUMENTS

| | | | |
|---|---|---|---|
| 1,425,995 A | * | 8/1922 | McGiveney |
| 3,666,134 A | * | 5/1972 | Rauch |
| 4,594,750 A | * | 6/1986 | Carcas |
| D312,244 S | | 11/1990 | Collins et al. |
| D336,074 S | | 6/1993 | Friend et al. |
| 5,274,881 A | * | 1/1994 | DeRosa |
| 6,000,550 A | * | 12/1999 | Simpson et al. ........ 220/840 X |
| 6,089,392 A | * | 7/2000 | Daoud ....................... 220/4.02 |
| 6,105,809 A | * | 8/2000 | Yamanaka .............. 220/836 X |

* cited by examiner

Primary Examiner—Allan N. Shoap
Assistant Examiner—Robin Hylton
(74) Attorney, Agent, or Firm—Volpe and Koenig, P.C.

(57) ABSTRACT

An electronics enclosure includes first and second clamshell components which are hingedly coupled by engaged, respective hinge members. A biased latch is attached to one of the clamshell components and is moveable between a position where it is aligned with one of the hinge members and maintains the hinge engagement and a second non-aligned position where the hinge members can be disengaged and the clamshell components decoupled.

20 Claims, 13 Drawing Sheets

ENCLOSURE HAVING A HINGE MEMBER BIASED BY A HAND-OPERABLE LATCH

This application claims the benefit of U.S. Provisional Application No. 60/126,463 filed on Mar. 26, 1999.

BACKGROUND

The present invention relates to electronics enclosures. More particularly, the invention pertains to an enclosure for electronic components which includes a hand-operable latch to facilitate removal of the enclosure cover.

Electronic equipment, such as telecommunication or computing hardware, typically comprises a plurality of printed circuit boards which are mounted within an environmental enclosure. Enclosures are required in an outdoor environment to prevent environmental elements such as rain, snow, sleet and flying debris from damaging the electronic components. For indoor applications, enclosures are used to prevent inadvertent damage to electronic components by people working in the vicinity of the enclosures. Additionally, enclosures are required to prevent removal of, or tampering with, electronic components by unauthorized individuals.

An illustrative electronics enclosure 5 is shown in FIG. 1. The enclosure 5 comprises a cover 10 and a housing 20. The cover 10 is designed for mating engagement with the housing 20 such that environmental elements cannot enter the enclosure 5 when the cover 10 is in a closed position as shown in FIG. 2. The cover 10 is coupled to the housing 20 via a plurality of hinges 25 to allow the cover 10 to be opened for repair, maintenance, or upgrading of the components inside the enclosure 5. At times, it is beneficial to completely remove the cover 10 to facilitate the work. In those instances where the cover contains a portion of the active electrical components, the time required to repair a failed unit can be reduced by changing out the cover. To permit such, the hinges 25 must be separable.

Referring to FIG. 2, the hinges 25 comprise a pin 27, pin lugs 29 and a socket 31. The pin lugs 29 are fixed to the housing 20 and secure the pin 27 firmly in place. The socket 31 is engaged with the pin 27 to secure the cover 10 in mating engagement with the housing 20. A locking mechanism 33 latches the cover 10 to the housing 20. As long as the locking mechanism 33 is engaged to latch the cover 10 in a closed position with the housing 20, the cover 10 will prevent materials from entering the enclosure 5. In order to remove the cover 10, the locking mechanism 33 is disengaged and the cover 20 is rotated beyond 180° such that the open side of the socket 31 faces the housing 20. In this position, the cover 10 may be removed from the housing 20.

Although this design facilitates removal and installation of the cover 20, it has design drawbacks and introduces negative safety implications. Since the cover 10 must be rotated beyond 180°, this design sometimes cannot be used for wall mounts since, depending on the depth of the cover casting, it may not be possible to achieve such rotation. Another drawback with this type of design is that in certain mounting orientations, if the cover 10 inadvertently opens, the cover 10 will swing freely and separate from the housing 20. Since electronic enclosures 5, are often located above pedestrians, such as on telephone poles, buildings or CATV and telephone transmission lines, a falling cover 10 can create serious safety risks.

To address the safety concerns, another type of removable hinge 35 is often used. As shown in FIG. 3, this type of hinge 35 comprises two pin lugs 37, for securing the pin (not shown) and a socket 39. The socket 39 is fixed securely to the housing 40 with a bolt 41. As shown in the top view of the enclosure 34 in FIG. 4, the cover 42 cannot be removed from the housing 40 without removing each of the three bolts 41. Although this addresses the safety concerns of the design shown in FIGS. 1 and 2, this design presents negative implications for technical personnel. Namely, technical personnel must have the proper tools for removal of the bolts 41. Additionally, this design increases the risk of dropping small parts such as the bolts 41, the sockets 39, the cover 42 or even the removal tools when servicing the electronics enclosure 34. Accordingly, this design is also undesirable.

Other designs which utilize blocking screws, "barrel nuts" or enclosures with a cover retained permanently to the housing, are also subject to safety or servicing drawbacks.

Accordingly, there exists a need for an electronics enclosure design which facilitates separation of the cover from the housing quickly, without tools and without the removal of hardware from the enclosure. The latch should positively retain the cover to the housing in any orientation unless the latch is purposely activated by technical personnel.

SUMMARY

The present invention provides an electronics enclosure including first and second clamshell components. Each component includes a hinge member and the components are hingedly coupled by engagement of the respective hinge members. A biased latch is attached to one of the clamshell components. It is moveable between a position aligned with a portion of the opposite hinge member and a second position nonaligned therewith. In the first position, the latch maintains engagement of the hinge members. In the second position, the hinge members can be disengaged and the clamshell components separated. In the preferred embodiment, one of the hinge members includes a pin and the other includes a pin receiving bore.

BRIEF DESCRIPTION OF THE DRAWING(S)

DETAILED DESCRIPTION OF THE PREFERRED EMBODIMENTS

Figure 1:
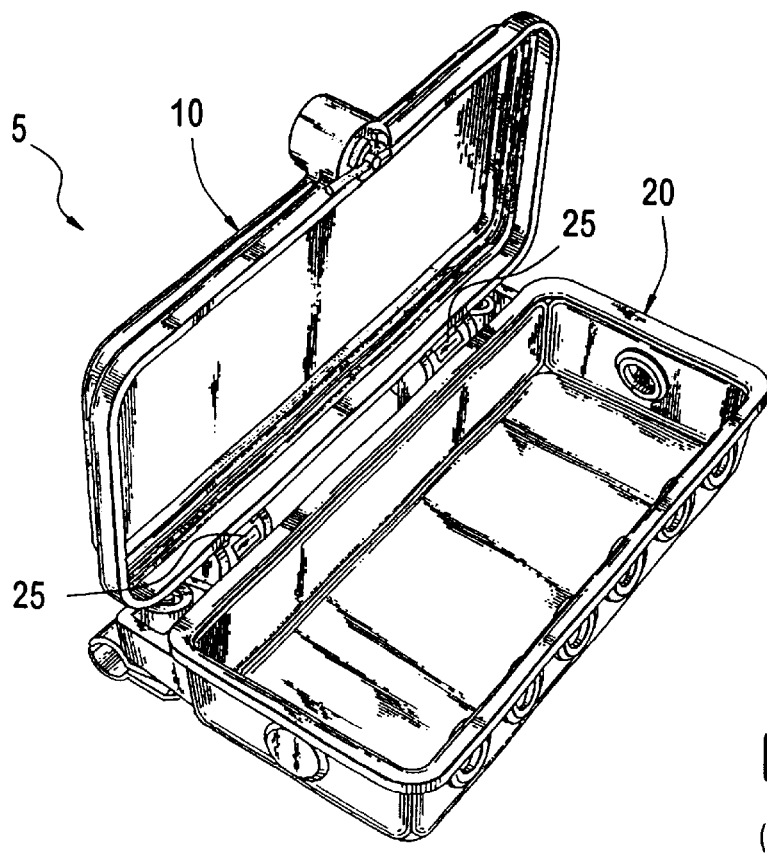
FIG. 1 is a front, top isometric view of a prior art electronics enclosure with its cover open.
Figure 2:
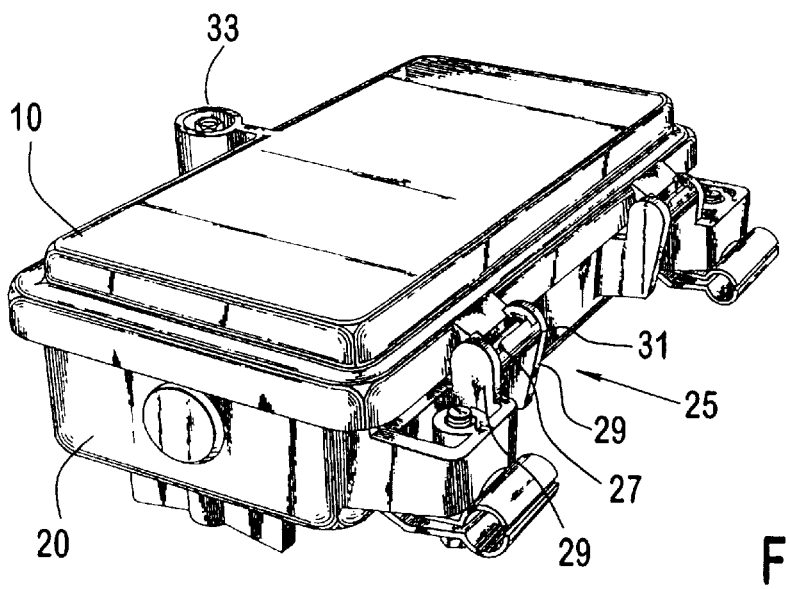
FIG. 2 is a rear, top isometric view of the electronics enclosure of FIG. 1 with its cover closed.
Figure 3:
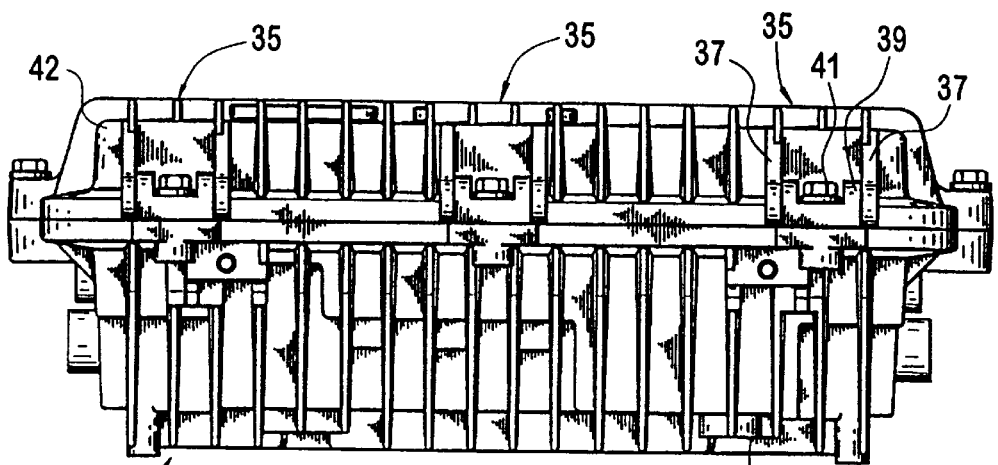
FIG. 3 is a front elevation view of an alternative prior art electronics enclosure with its cover closed.
Figure 4:
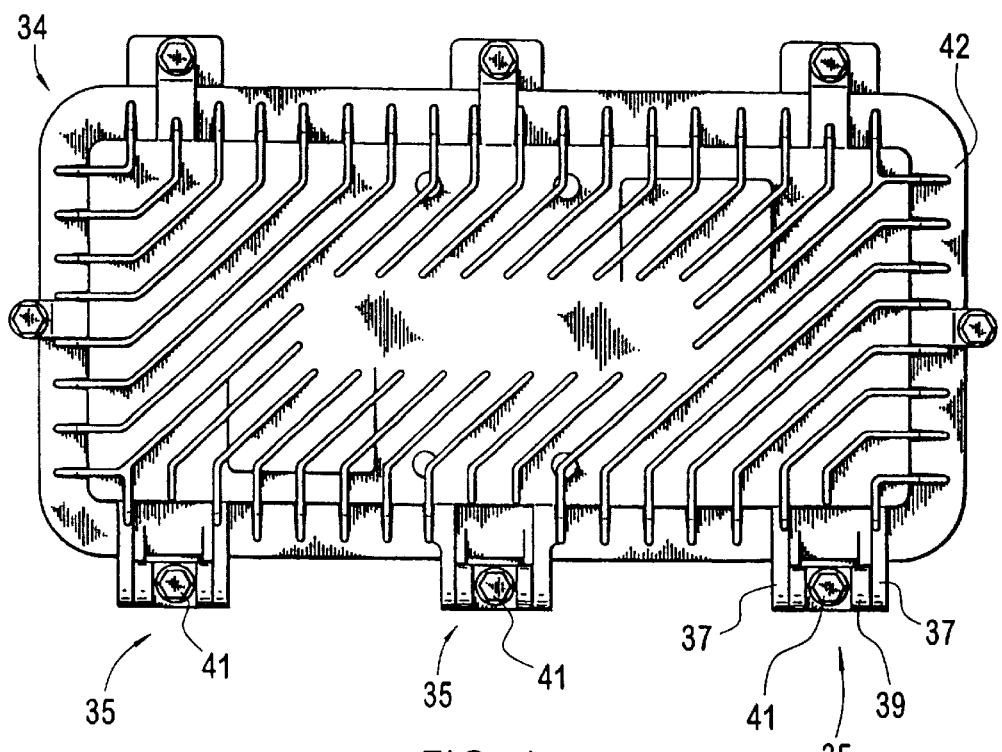
FIG. 4 is a top plan view of the electronics enclosure of FIG. 3 with its cover closed.

The preferred embodiments of the present invention will be described with reference to the drawing figures where like numerals represent like elements throughout.

Figure 5:
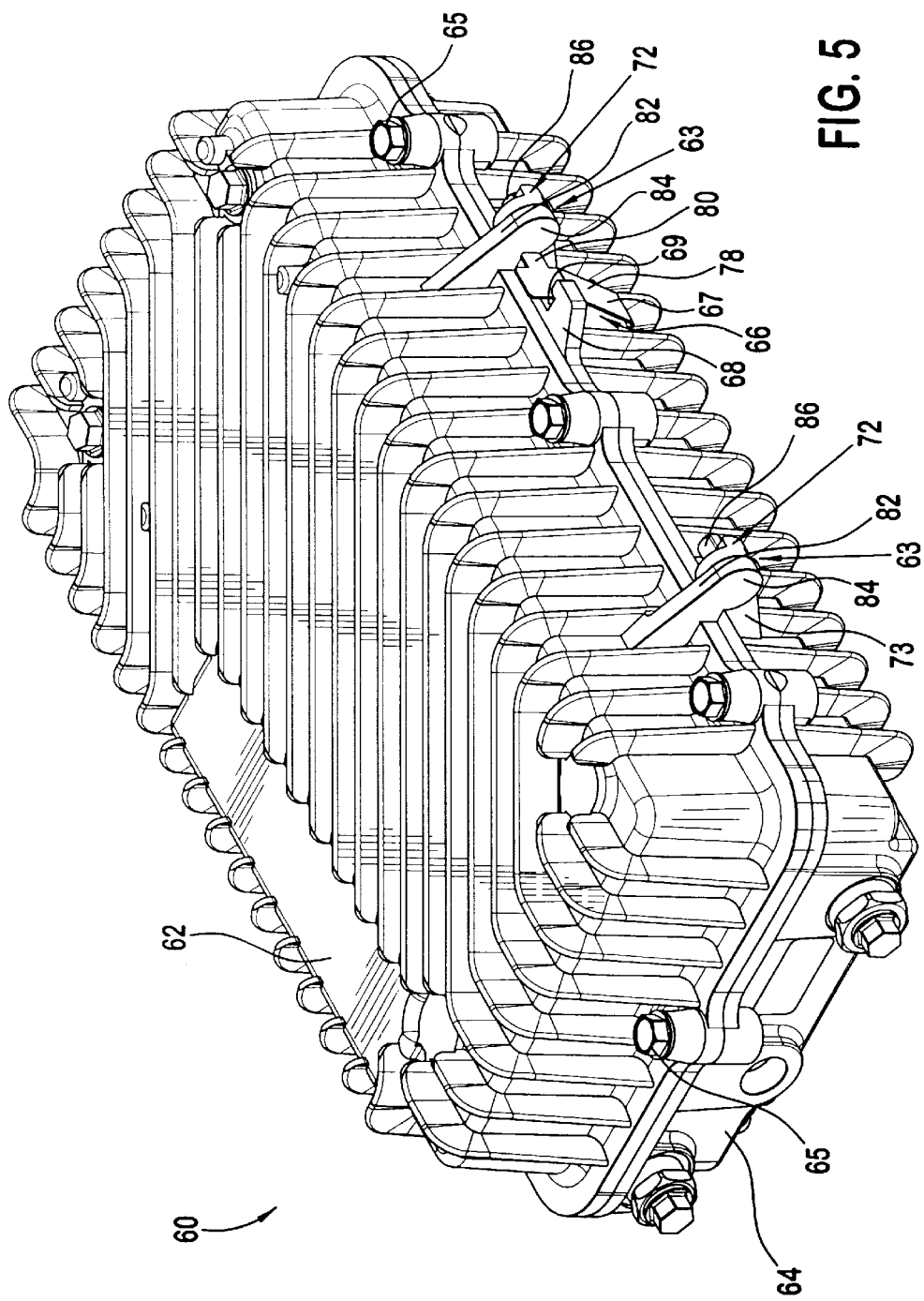
FIG. 5 is a rear, top isometric view of a preferred embodiment of the electronics enclosure of the present invention with its cover closed and the latch in a securing position.

Referring to FIG. 5, the preferred embodiment of the present invention is shown. The preferred electronics enclosure 60 comprises a pair of clamshell components 62 and 64, a pair of releasable hinges 63 and a latch assembly 66. The clamshell components 62,64 are hingedly coupled by the releasable hinges 63 and may be removed from one another. The clamshell components 62, 64 can be closed and locked to one another by bolts 65 or other securing means. In the preferred embodiment, the first clamshell component 62 is a moveable cover and the second clamshell component 64 is the mounting housing.

Figure 7:
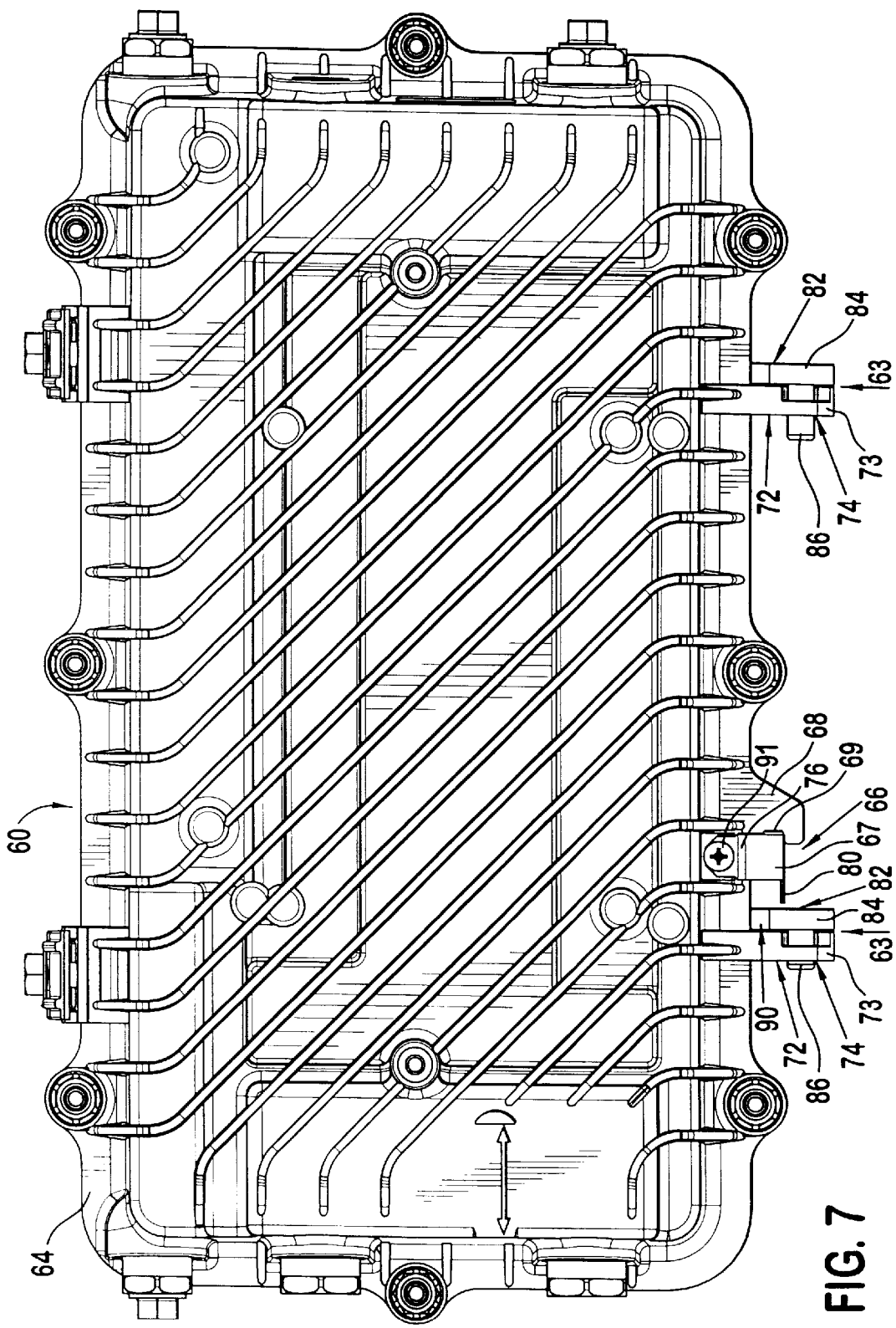
FIG. 7 is a bottom plan view of the electronics enclosure of FIG. 5 with its cover closed and the latch in the securing position.

Each hinge 63 comprises first and second hinge members 72 and 82. In the preferred embodiment, the first hinge member 72 extends from clamshell component 64 and the second hinge member 82 extends from the other clamshell component 62. The latch assembly 66 is positioned on the same clamshell component 64 as the first hinge member. In the preferred embodiment, each hinge member 72,82 includes an arm portion 73 and 84, respectively, and either a pin 86 or a pin receiving bore 74. In the preferred embodiment, the bore 74 extends through the arm 73 to define an aperture therethrough and the pin 86 extends from extending arm 84, but such can be reversed. The pin 86 is sized to be received in the bore 74 and preferably extends completely therethrough. Arm 84 is preferably angled to align the pin 86 with the bore 74 and to define a gap 90 between the arm 84 and the enclosure 60, as shown in FIG. 7. The hinge members 72, 82 are positioned on the respective enclosure components 62,64 such that the pins 86 can be aligned with and inserted in the bores 74 with the clamshell components 62 and 64 in a desired alignment.

The latch assembly 66 is positioned adjacent to one of the hinges 63 and maintains the hinges 63 in the operable configuration shown in FIG. 5. The preferred latch assembly 66 comprises a latch member 67 and a retention shoulder 68 and is positioned on the clamshell component such that, when it is engaged, the second hinge member 82 is positioned between the first hinge member 72 and the latch member 67. The latch member 67 includes an attachment portion 76 attached to clamshell component 64 via a screw 91 or other means, a body portion 78, and an abutment portion 80. The latch member 67 is biased away from the enclosure 60. The latch member 67 is preferably made from a corrosionresistant spring material to provide such bias, however, it may be biased by other means, for example, an independent coil spring.

Figure 6:
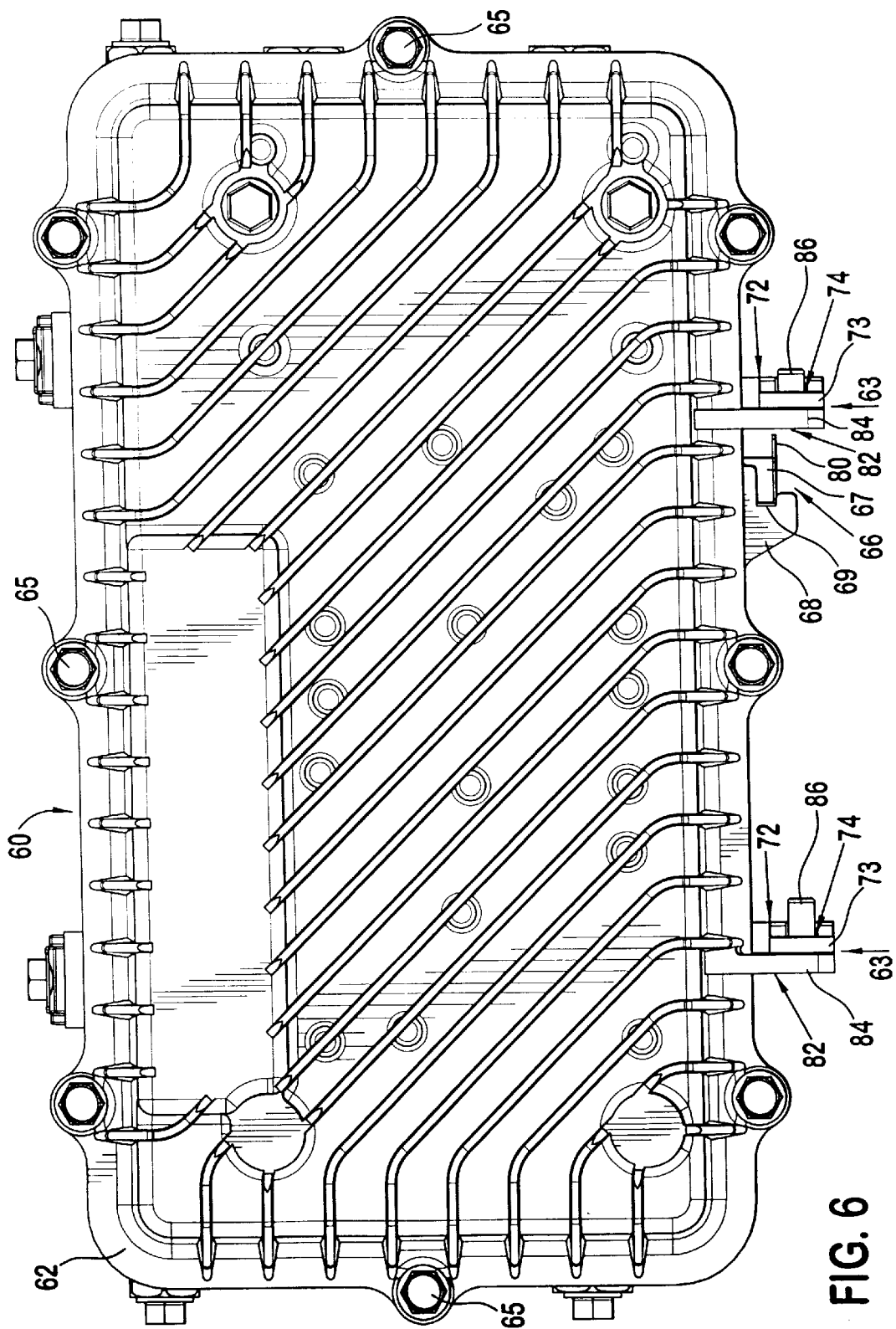
FIG. 6 is a top plan view of the electronics enclosure of FIG. 5 with its cover closed and the latch in the securing position.

The retention shoulder 68 may be formed integral with the clamshell component 64 or may be made separately and attached thereto. The retention shoulder 68 includes a notch 69 which receives the latch body 78 and limits its range of motion toward and away from the enclosure 60 and laterally (parallel to the enclosure) away from the hinge 63. The lateral restriction supports the latch member 67 in applications where the enclosure 60 is mounted vertically and the weight of the one of the clamshell components may exert a lateral force on the latch member 67. The notch 69 is configured such that the biased latch member 67 has a rest position wherein the abutment portion 80 is aligned with a portion of the second hinge member 82. See FIGS. 6 and 7. In this position, the latch member 67 prevents substantial lateral movement of the second hinge member 82 relative to the first hinge member 72, thereby maintaining the hinge 63 in an engaged, operable configuration. The abutment portion 80 preferably extends from the latch body 78 or alternatively, the latch body 78 may be formed wide enough such that the abutment portion 80 is an edge of the body 78.

Having described the components of the preferred embodiment of the present invention, its use will be described with reference to FIGS. 5 and 8–13.

Referring to FIG. 5, the enclosure 60 is assembled with the hinge pins 86 engaged in the hinge bores 74 and the latch member 67 in its rest position maintaining the hinge 63 in its operable configuration. The clamshell components 62, 64 are locked to one another by a plurality of bolts 65. The enclosure 60 can be mounted in any desired orientation. Even if mounted in a vertical orientation, the retention shoulder 68 will support the latch member 67 and prevent excessive lateral movement.

Figure 8:
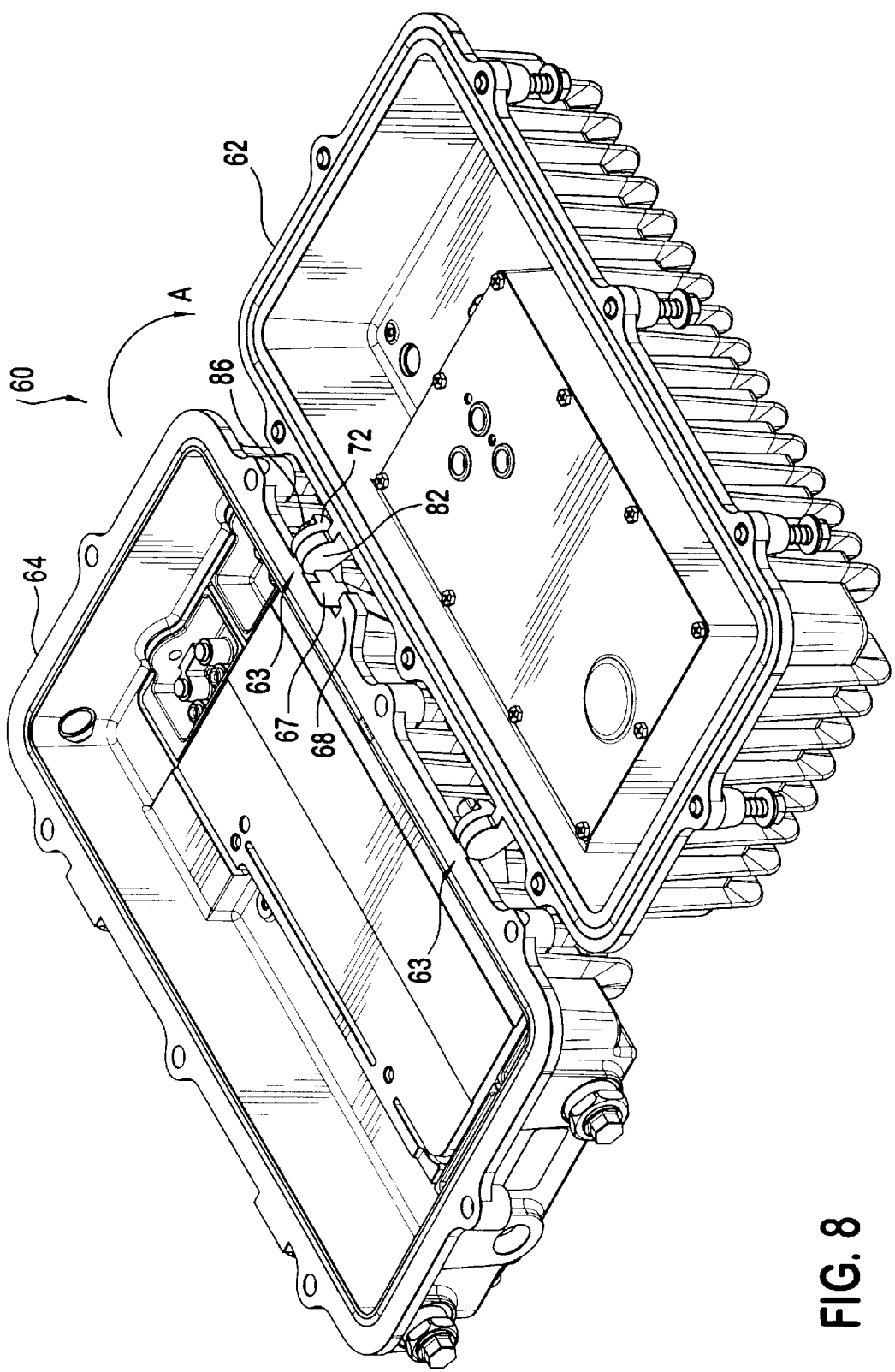
FIG. 8 is a rear, top isometric view of the electronics enclosure of FIG. 5 with its cover open and the latch in the securing position.
Figure 9:
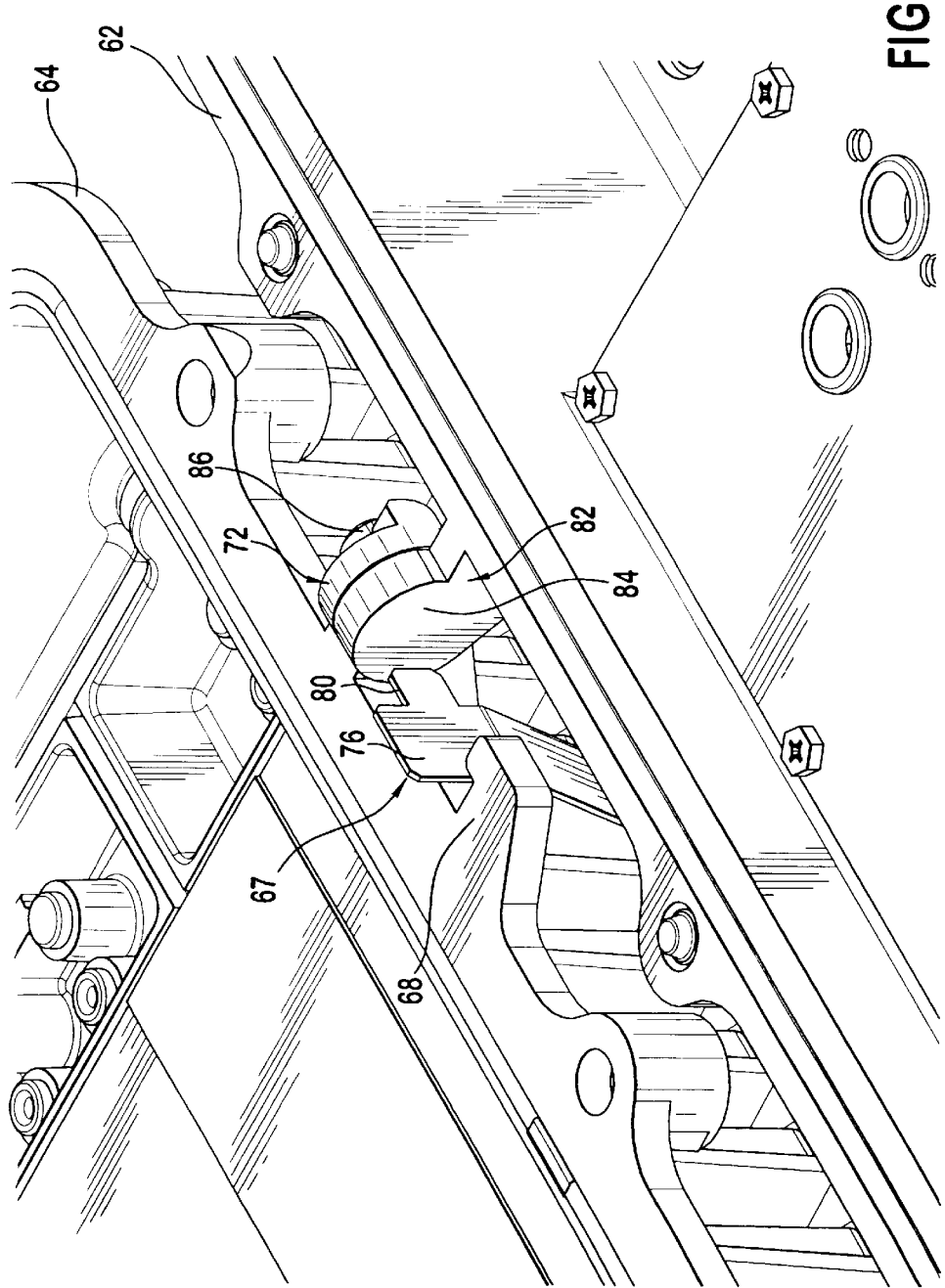
FIG. 9 is an exploded view of a portion of the electronics enclosure as shown in FIG. 8.
Figure 10:
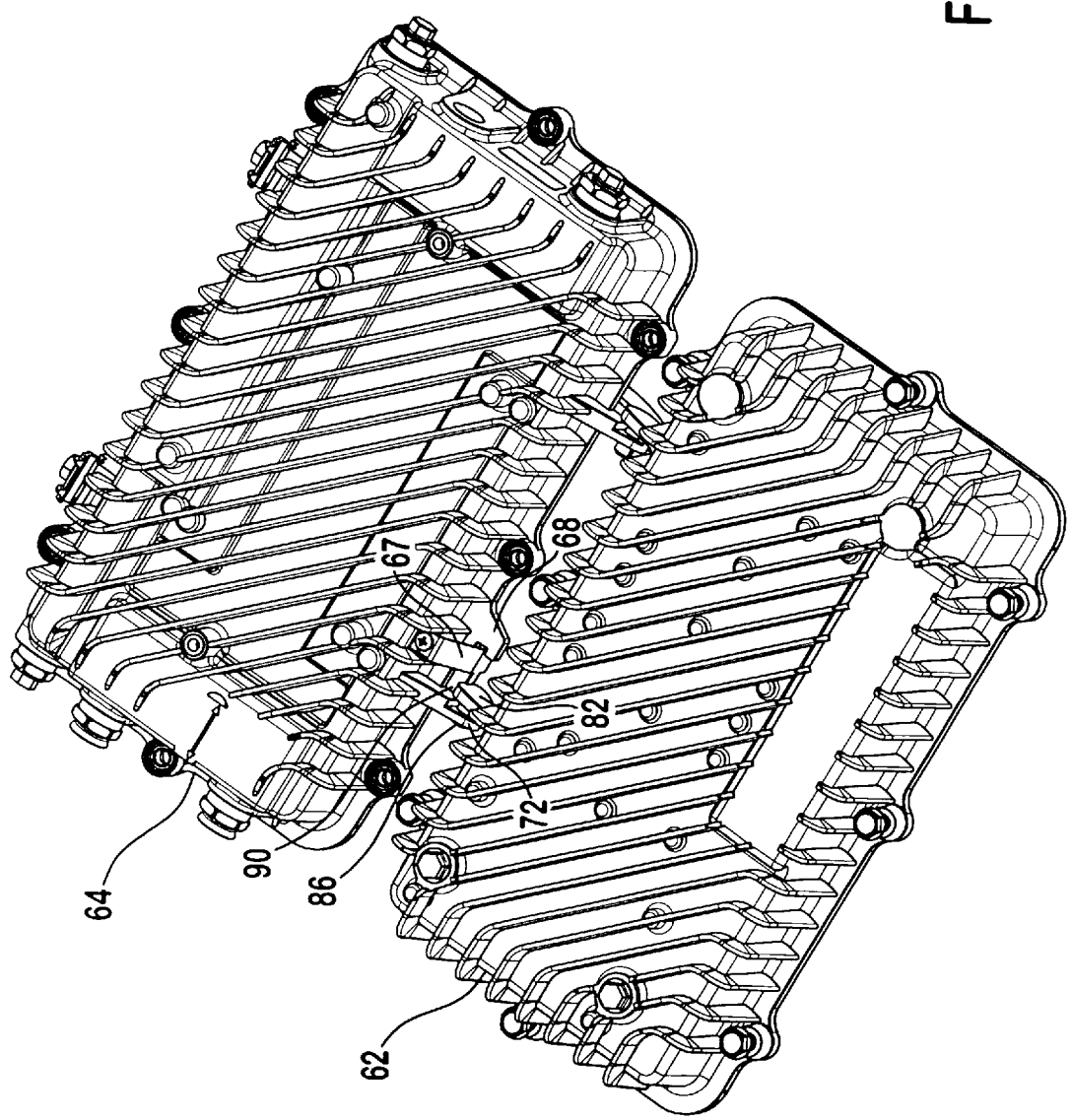
FIG. 10 is a rear, bottom isometric view of the electronics enclosure of FIG. 5 with its cover open and the latch in the securing position.
Figure 11:
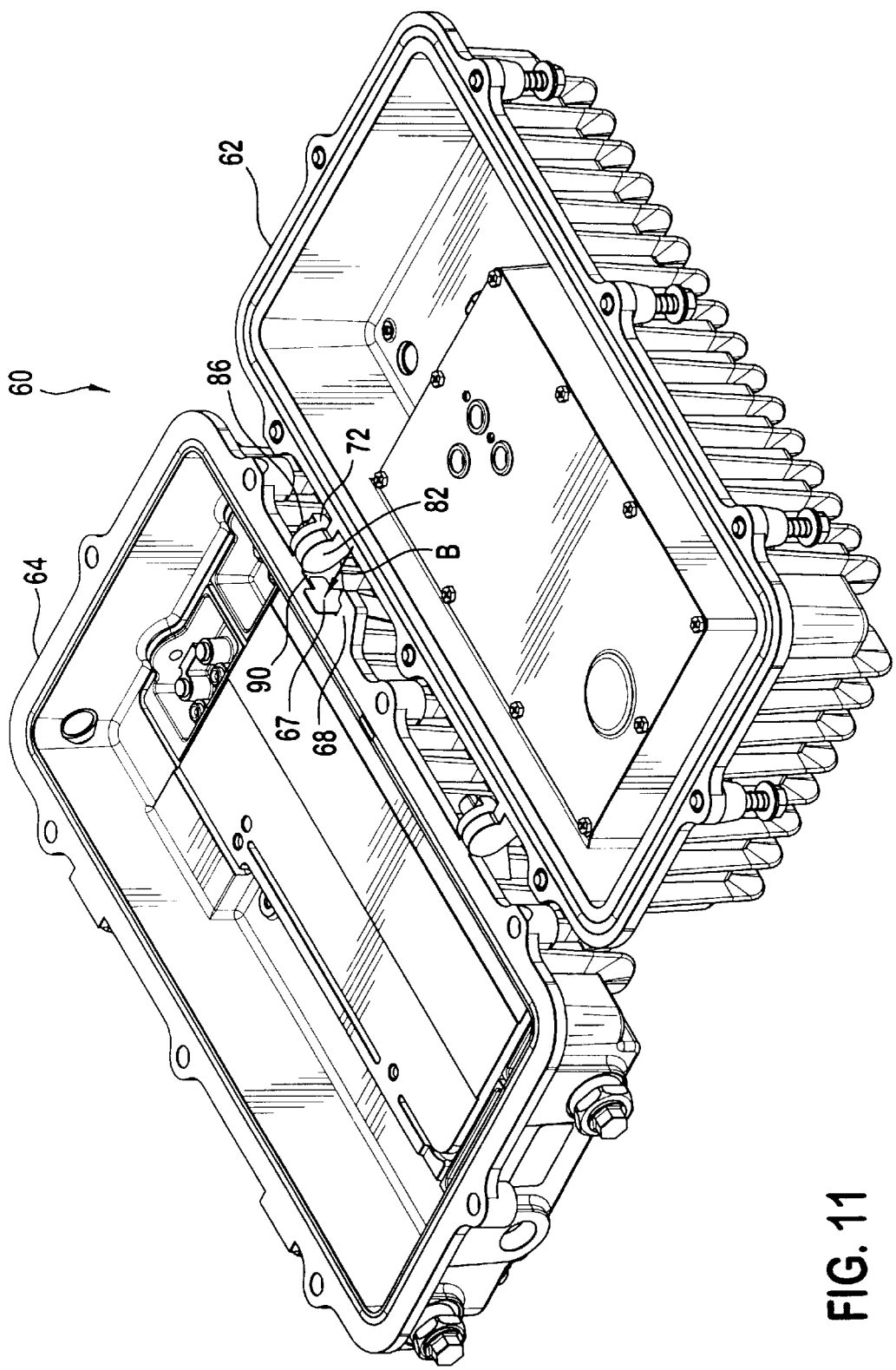
FIG. 11 is a rear, top isometric view of the electronics enclosure of FIG. 5 with its cover open and the latch in a release position.
Figure 12:
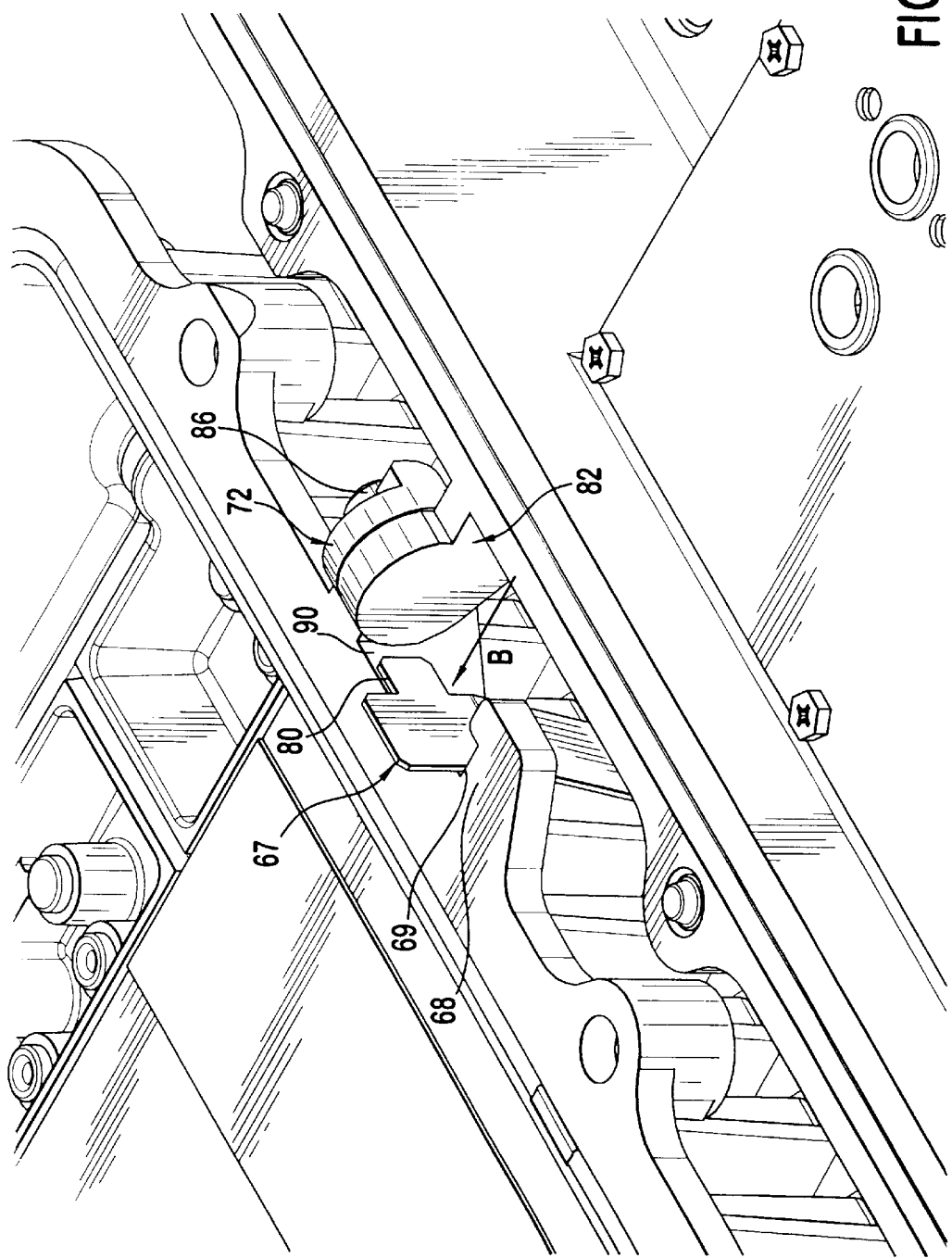
FIG. 12 is an exploded view of a portion of the electronics enclosure as shown in FIG. 11.
Figure 13:
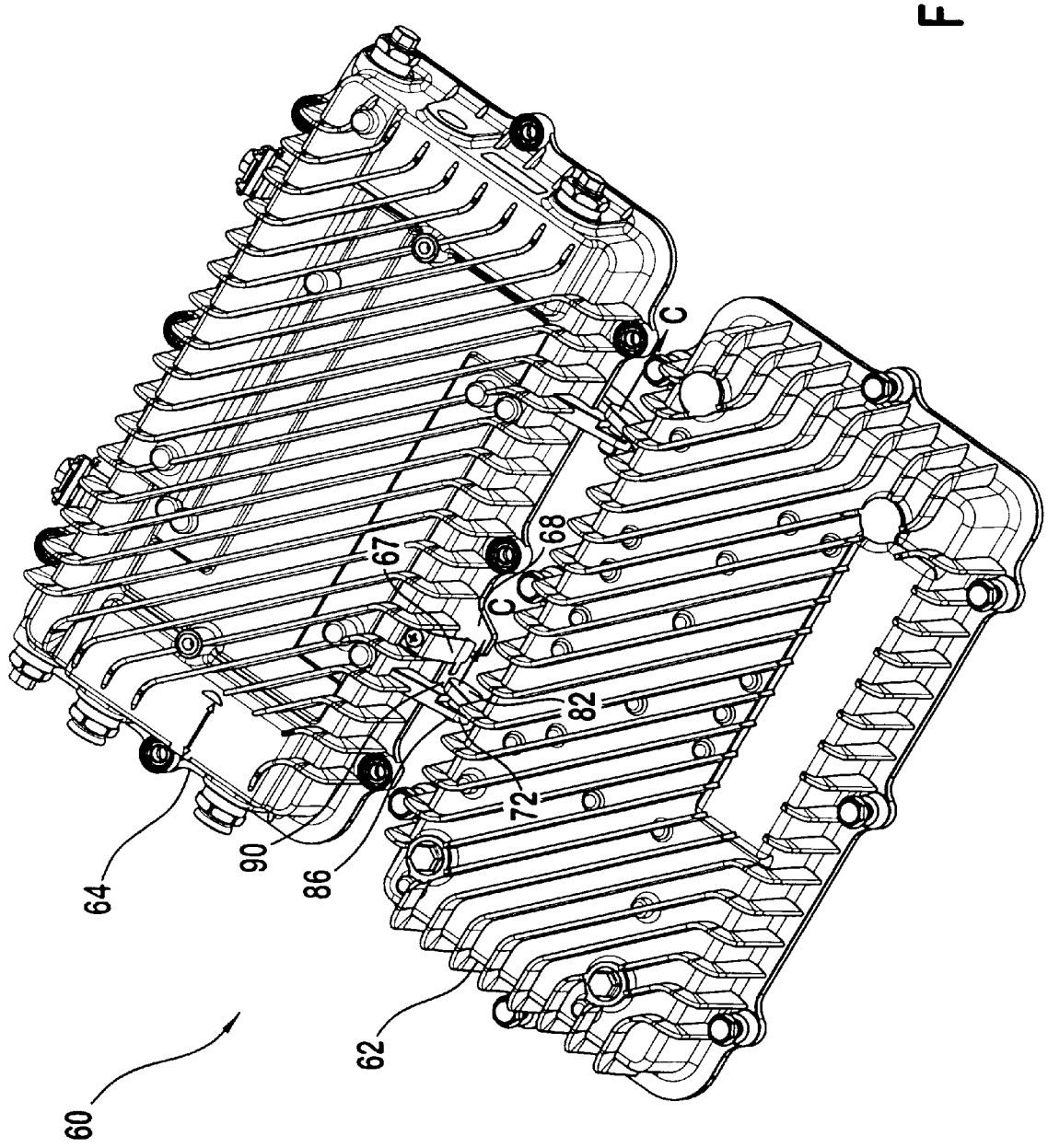
FIG. 13 is a rear, bottom isometric view of the electronics enclosure of FIG. 5 with its cover open and the latch in the release position.
Figure 14:
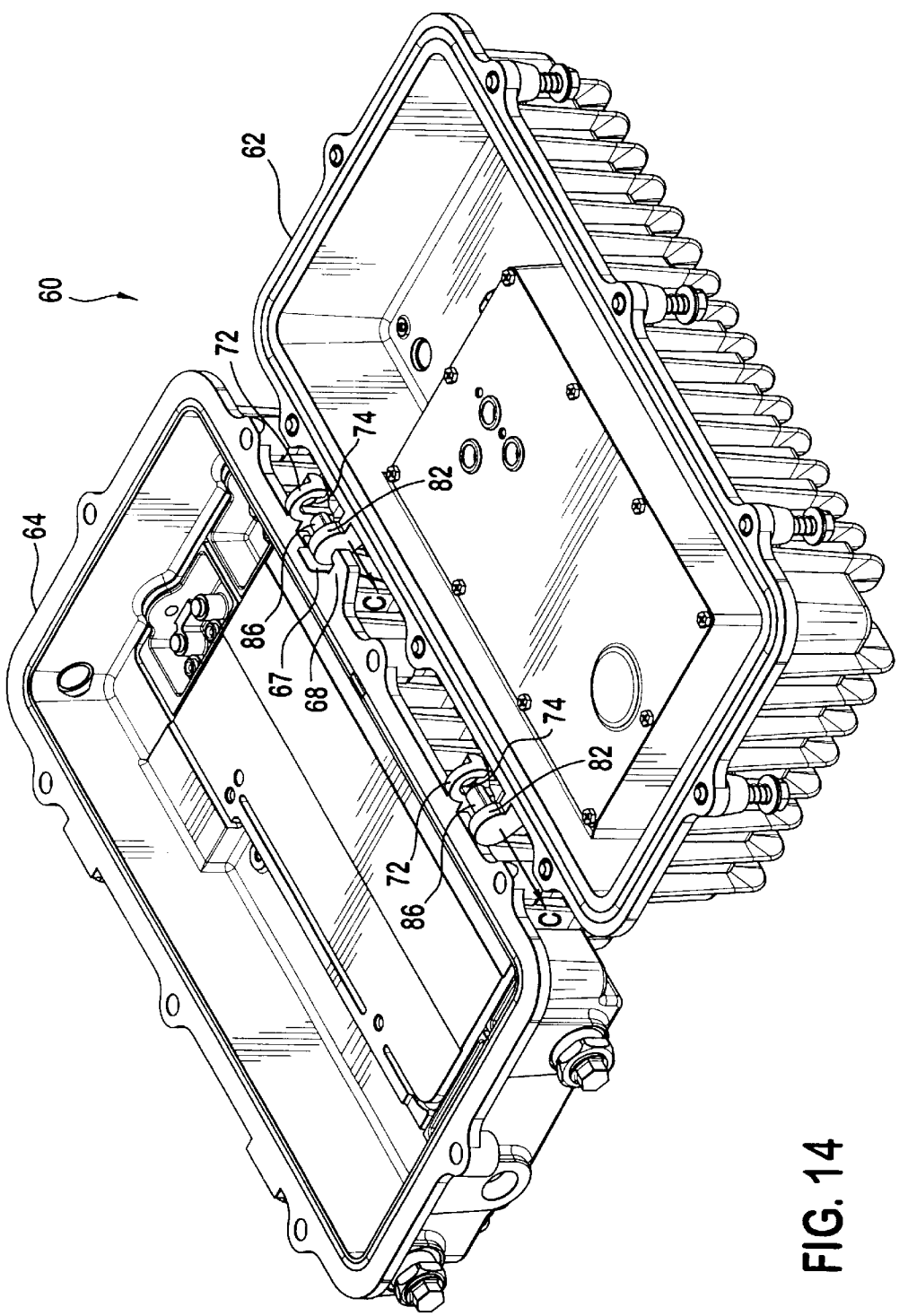
FIG. 14 is a rear, top isometric view of the electronics enclosure of FIG. 5 with the open cover moved relative to the housing.

Referring to FIG. 8, the first clamshell component 62 can be opened to access the internal components by loosening the bolts 65 and rotating the first clamshell component 62 relative to the second clamshell component 64 about the hinges 63, as indicated by arrow A. The latch member 67 is unaffected by the unlocking and rotating of the first clamshell component 62 and remains aligned with a portion of the second hinge member 82, as shown in FIGS. 8–10, thereby maintaining the operable configuration of the hinges 63. This relationship will be maintained irrespective of the amount of rotation. With the first clamshell component 62 open, an operator can perform the desired tasks with reduced concern of the first clamshell component 62 inadvertently disengaging from the second clamshell component 64.

Figure 15:
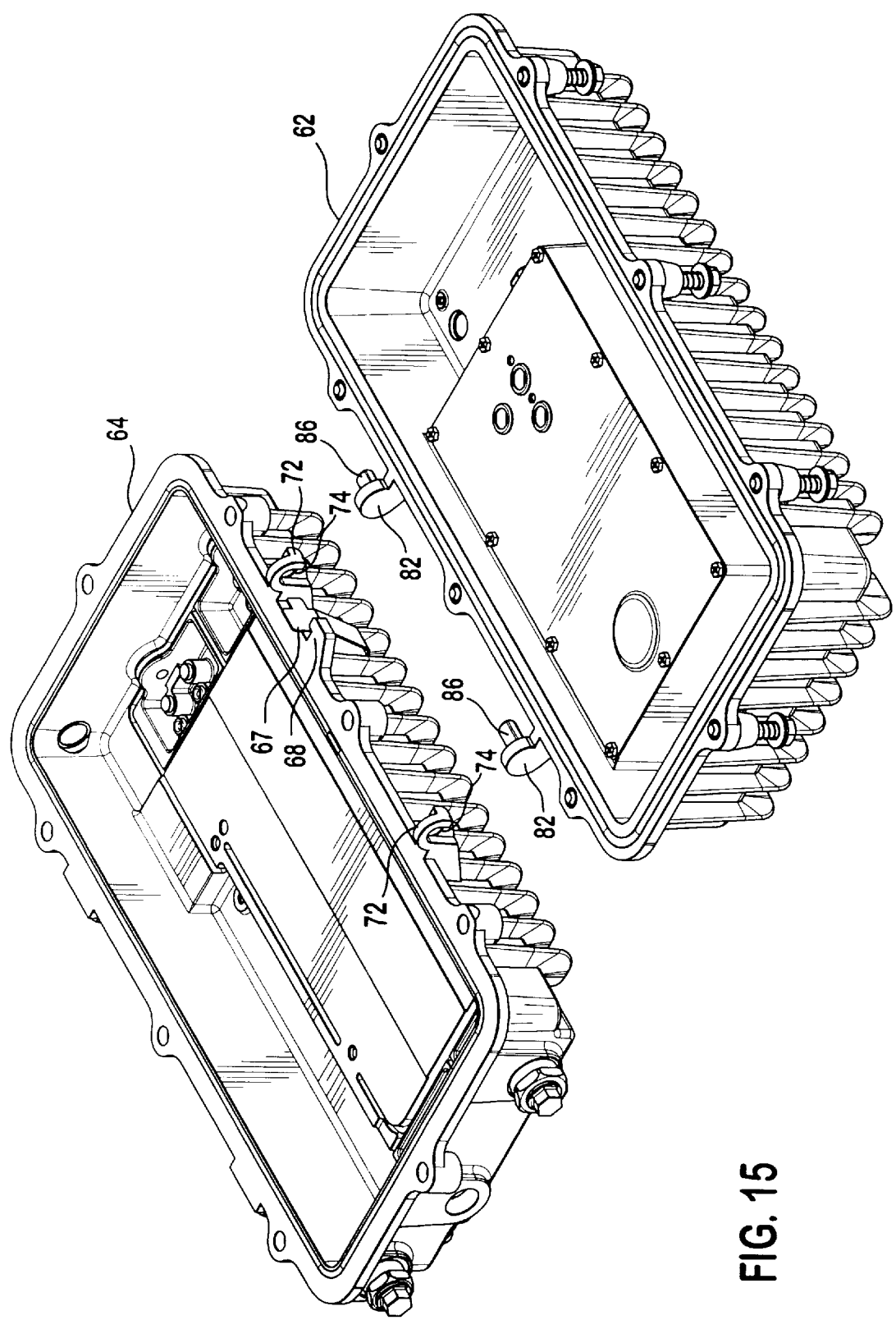
FIG. 15 is a rear, top isometric view of the electronics enclosure of FIG. 5 with the cover and housing separated.

Referring to FIGS. 11–15, the first clamshell component 62 can easily be removed from the second clamshell component 64, if desired, by activating the latch member 67. The latch member 67 is depressed toward the second clamshell component 64, as indicated by arrows B in FIGS. 11 and 12, to a disengaged position where it is aligned with the gap 90 between arm 84 and the second clamshell component 64. The second hinge member 82 is then free to be moved relative to the first hinge member 72, as indicated by arrows C in FIGS. 13 and 14, to disengage the pins 86 from the bores 74. The first clamshell component 62 may then be separated from the second clamshell component 64, as shown in FIG. 15. After the first clamshell component is removed, the latch member 67 can be released whereby it will return to its relaxed position. No tools are required to remove the first clamshell component 62. Since, as illustrated in the figures, the gap 90 is maintained as the first clamshell component 62 is rotated over its full range of motion, the first clamshell component 62 can be removed at any point in the range of motion and does not require a specific rotation.

To return the removed clamshell component 62 or attach a new clamshell component, the latch member 67 is moved to the disengaged position, the pins 86 are aligned with and inserted into the bores 74 and the latch member 67 is released whereby it returns to its relaxed position.

The design of the present invention has several advantages over prior art designs. Namely, the latch 66 accelerates the servicing or upgrade of the electronic components inside the enclosure 60 since no specialized tools or parts are required to separate the first clamshell component 62 from the second clamshell component 64. All of the hardware required for fastening the first clamshell component 62 to the second clamshell component 64 remains permanently attached to one of the clamshell components, thereby eliminating the possibility that technical personnel could fail to reinstall the hardware. This eliminates existing design problems wherein missing or incorrectly installed hardware can pose a significant safety risk to pedestrians.

The ease with which the clamshell components can be separated from one another permits manufacturers to build some of the electronics directly on one of the clamshell components. Accordingly, there is no need for separate electronic "boxes" mounted inside the clamshell component. Field servicing of the electronics may be accomplished quickly by detaching the clamshell component and replacing it with another clamshell component.

Various modifications may be imparted to the present invention without departing from the spirit and scope of the invention.

What is claimed is:

1. An electrical component enclosure comprising:
   first and second clamshell components;
   a first hinge member extending from the first clamshell component;
   a second hinge member extending from the second clamshell component, the first and second hinge members engage one another to hingedly couple the first and second clamshell components about a hinge axis; and
   a biased latch member attached to the first clamshell component and moveable between a first position wherein the biased latch member is aligned with a portion of the second hinge member and maintains the engagement of the first and second hinge members and a second position nonaligned with the second hinge member such that the first and second hinge members can be disengaged to decouple the first and second clamshell components by moving the second clamshell component away from the first clamshell component in a direction parallel to the hinge axis.

2. The enclosure of claim 1 wherein the first hinge member includes a pin and the second hinge member includes a bore configured to receive the pin.

3. The enclosure of claim 1 wherein the second hinge member includes a pin and the first hinge member includes a bore configured to receive the pin.

4. The enclosure of claim 1 wherein the aligned portion of the second hinge member is positioned between the latch member and the first hinge member when the latch member is in the first position.

5. The enclosure of claim 4 wherein a gap is defined between the aligned portion of the second hinge member and the clamshell components and the latch member is aligned with the gap when the latch member is in the second position.

6. The enclosure of claim 1 wherein the latch member is manufactured from a spring material and is cantilevered to the first clamshell component.

7. The enclosure of claim 1 wherein the latch member is biased by an independent spring member.

8. An electrical component enclosure comprising:
   first and second clamshell components;
   a first hinge member extending from the first clamshell component;
   a second hinge member extending from the second clamshell component, the first and second hinge members engage one another to hingedly couple the first and second clamshell components;
   a biased latch member attached to the first clamshell component and moveable between a first position wherein it is aligned with a portion of the second hinge member and maintains the engagement of the first and second hinge members and a second position nonaligned with the second hinge member such that the first and second hinge members can be disengaged to decouple the first and second clamshell components; and
   a retention shoulder extending from the first clamshell component and including a notch therein configured to receive a portion of the latch member and limit the range of motion of the latch member.

9. The enclosure of claim 8 wherein the notch limits the range the latch member may move away from the clamshell components and thereby defines the first position.

10. The enclosure of claim 8 wherein the retention shoulder limits the range that the biased latch member may move away from the first hinge member in a direction parallel to the hinge axis.

11. The enclosure of claim 8 wherein the retention shoulder limits the range that the biased latch member may move away from the first clamshell component in a direction generally normal to the hinge axis.

12. The enclosure of claim 1 wherein the first clamshell component is a fixed housing and the second clamshell component is a removable cover.

13. The enclosure of claim 1 wherein the second clamshell component is a fixed housing and the first clamshell component is a removable cover.

14. The enclosure of claim 1 wherein the second clamshell component houses active electrical components.

15. The enclosure of claim 1, wherein the biased latch member has a hinge member engaging end that is aligned with a portion of the second hinge member, when the biased latch member is in the first position, wherein the first and second hinge members can be disengaged to decouple the first and second clamshell components when the hinge member engaging end is moved toward the first clamshell component.

16. The enclosure of claim 1 wherein, the second hinge member comprises a pin extending from and formed as one piece with the second hinge member, the pin having a distal end that is engageable with the first clamshell component via the first hinge member such that the second hinge member is slidably engageable with the first hinge member.

17. An electrical component enclosure comprising:
   first and second clamshell components;
   a first hinge member extending from the first clamshell component;
   a second hinge member extending from the second clamshell component, the first and second hinge members engage one another to hingedly couple the first and second clamshell components, the second hinge member having a pin having a longitudinal axis and capable of slidably engaging the first hinge member; and
   a biased latch member attached to the first clamshell component and moveable between a first position, wherein the biased latch member is aligned with a portion of the second hinge member and maintains the engagement of the pin and the first hinge member by preventing the second hinge member from moving away from the first hinge member in a direction parallel to the longitudinal axis, and a second position, wherein the biased latch member is nonaligned with the second hinge member such that the first and second hinge members can be disengaged to decouple the first and second clamshell components.

18. The enclosure of claim 17, wherein the biased latch member has a hinge member engaging end that is aligned with a portion of the second hinge member when the biased latch member is in the first position, wherein the first and second hinge members can be disengaged to decouple the first and second clamshell components when the hinge member engaging end is moved toward the first clamshell component.

19. The enclosure of claim 17 wherein the pin extends from and is formed as one piece with the second hinge member, the pin having a distal end that is engageable with the first clamshell component via the first hinge member such that the second hinge member is slidably engageable with the first hinge member.

20. The enclosure of claim 17, wherein the first and second hinge members can be disengaged to decouple the first and second clamshell components by moving the second clamshell component away from the first clamshell component in a direction parallel to the longitudinal axis.

* * * * *